US006713686B2

(12) United States Patent
Becker et al.

(10) Patent No.: US 6,713,686 B2
(45) Date of Patent: Mar. 30, 2004

(54) APPARATUS AND METHOD FOR REPAIRING ELECTRONIC PACKAGES

(75) Inventors: Wiren D. Becker, Hyde Park, NY (US); Dinesh Gupta, Hopewell Junction, NY (US); Sudipta K. Ray, Wappingers Falls, NY (US); Robert A. Rita, Wappingers Falls, NY (US); Herbert I. Stoller, Poughkeepsie, NY (US); Kathleen M. Wiley, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 10/053,362

(22) Filed: Jan. 18, 2002

(65) Prior Publication Data

US 2003/0136581 A1 Jul. 24, 2003

(51) Int. Cl.[7] .......................... H01R 12/04; H05K 1/11
(52) U.S. Cl. ....................... 174/262; 174/261; 174/264; 361/792; 361/803; 29/846
(58) Field of Search ................. 174/262, 255, 174/250, 260, 264, 261; 361/792, 795, 803, 761, 807, 760; 257/778, 723

(56) References Cited

U.S. PATENT DOCUMENTS

| 4,489,364 A | | 12/1984 | Chance et al. |
| 4,912,603 A | * | 3/1990 | Seyama ....................... 361/777 |
| 5,060,116 A | * | 10/1991 | Grobman et al. ............ 361/792 |
| 5,155,577 A | | 10/1992 | Chance et al. |
| 5,220,490 A | * | 6/1993 | Weigler et al. .............. 361/777 |
| 5,277,929 A | | 1/1994 | Seki et al. |
| 5,360,948 A | * | 11/1994 | Thornberg ................... 174/263 |
| 5,541,814 A | * | 7/1996 | Janai et al. .................. 361/778 |
| 5,747,095 A | | 5/1998 | McAllister et al. |
| 5,757,079 A | | 5/1998 | McAllister et al. |
| 5,917,229 A | * | 6/1999 | Nathan et al. ............... 257/529 |
| 6,101,710 A | | 8/2000 | Selinger et al. |
| 6,111,756 A | | 8/2000 | Moresco |
| 6,204,456 B1 | | 3/2001 | Lauffer et al. |
| 6,255,602 B1 | * | 7/2001 | Evans et al. ................. 174/262 |

* cited by examiner

*Primary Examiner*—Kamand Cuneo
*Assistant Examiner*—I B Patel
(74) *Attorney, Agent, or Firm*—RatnerPrestia; Ira D. Blecker, Esq.

(57) ABSTRACT

A multi chip module substrate arranged with repair vias and repair lines extending between repair vias of the chip sites of the module by which repairs can be effected to overcome defects in the module circuits and a method for effecting the repairs of defects in the circuits of this module. A defect can occur in any one of a first signal via, a second signal via, and a circuit line extending between and intended to electrically connect the first signal via and the second signal via. After a defective circuit is identified, the signal vias of the circuit are isolated. Then, the first signal via of the defective circuit is electrically connected to that repair via of the chip site having the first signal via that is connected to that repair via of the chip site having the second signal via and the second signal via of the defective circuit is electrically connected to that repair via of the chip site having the second signal via that is connected to that repair via of the chip site having the first signal via.

20 Claims, 2 Drawing Sheets

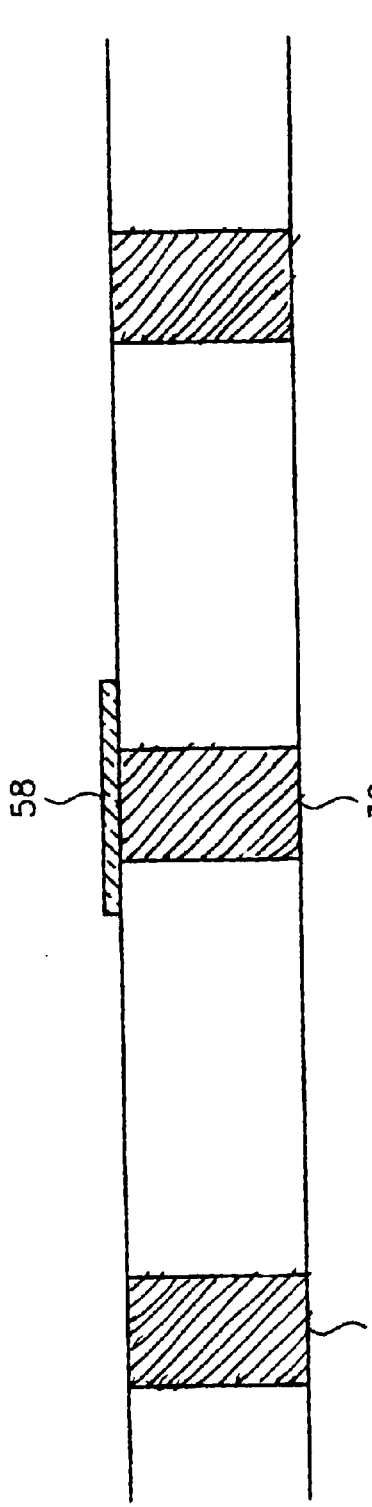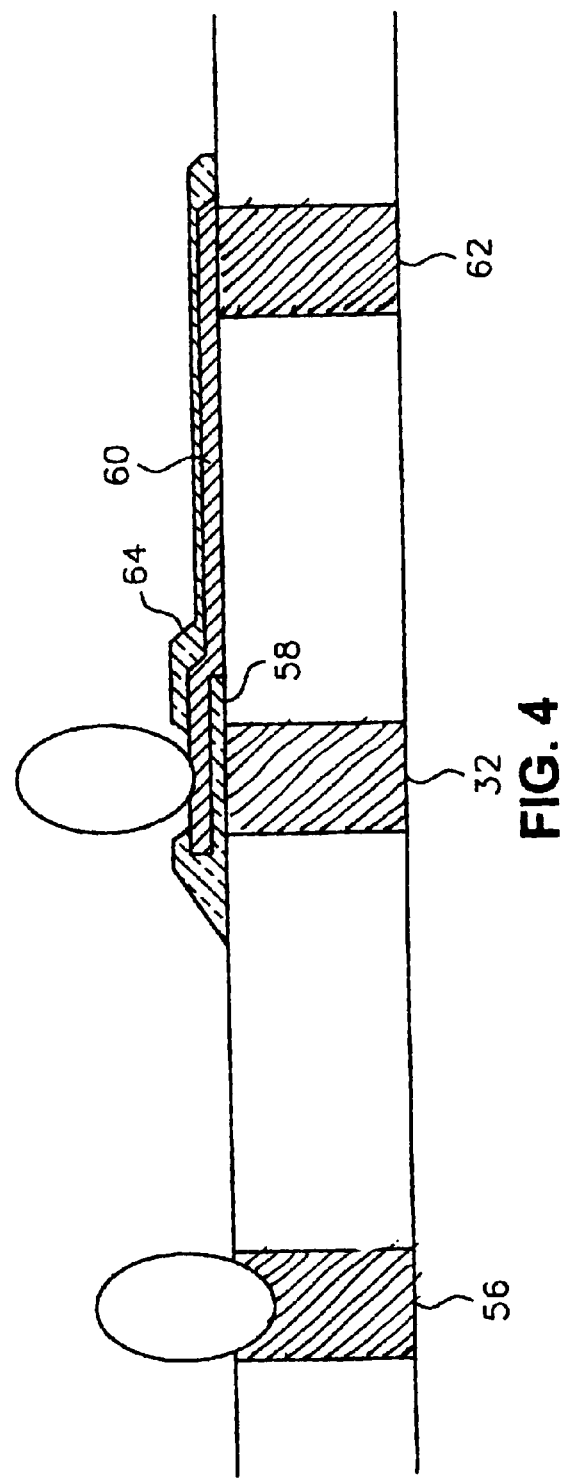

APPARATUS AND METHOD FOR
REPAIRING ELECTRONIC PACKAGES

TECHNICAL FIELD

The present invention relates, in general, to electronic packages, such as multi chip modules, cards, and boards and, in particular to apparatus and a method for repairing such electronic packages.

BACKGROUND OF THE INVENTION

There has been a recent move to use ceramic substrates without thin films as electronic packages in high end servers. These are large ceramic multi chip module substrates with four to twenty or more chips that are connected through wiring layers in a multi layer ceramic.

Typically, there are opens and shorts among nets in ceramic multi chip module substrates that are repaired today using thin film wiring layers on top of the ceramic substrate. Without such repairs, the substrate yield would be significantly lower and this low yield would increase the cost of the multi layer chip/multi chip module substrates. Thin film repairs, unfortunately, are very expensive.

Therefore, a non-thin film repair concept and process is desired that can be used after the ceramic substrates are sintered and electrically tested for opens and shorts among signal nets. The present invention provides a concept, wiring structure, and procedure that enables post-sinter repair of multi layer ceramic signal nets in multi chip modules without using expensive thin film processes. The present invention also is applicable to other electronic packages, such as cards and boards, but the repairs of such electronic packages have different process requirements from those described in this application.

In previous repair or engineering changes of multi layer ceramic signal nets in multi chip ceramics, a metal structure was employed that enabled the defective signal net to be electrically isolated from the substrate being repaired. Typically, this metal structure included a pad connection between the chip and the substrate, a fanout line to a repair/engineering change pad, and a delete line to a via capture pad. In the case of previous all-ceramic multi chip modules, these macro-structures were outside the chip area and took up considerable top surface space, thus limiting the number of chips that could be placed on the substrate. In the case of thin film substrates, these were typically microstructures located within the cage area of the pad connection between the chip and the substrate. This latter approach was only possible with thin film substrates because of the extremely fine feature sizes required. To effect the isolation, the metal delete line of this structure was typically cut using a laser tool.

SUMMARY OF THE INVENTION

It is an objective of the present invention to provide a new and improved multi chip module substrate.

It is another objective of the present invention to provide a multi chip module substrate by which repairs can be effected in cost effective manner.

It is a further objective of the present invention to provide a new and improved method of repairing an electronic package.

It is yet another objective of the present invention to provide a method of repairing an electronic package that is cost effective.

To achieve these and other objectives, a multi chip module substrate, constructed in accordance with the present invention, includes a plurality of chip sites, each having a plurality of signal vias and a plurality of repair vias. This multi chip module also has a circuit line net having a plurality of circuit lines. Each of the circuit lines extends between and is intended to electrically connect selected signal vias. A multi chip module substrate, constructed in accordance with the present invention, further includes a repair line net having a plurality of groups of repair lines. Each repair line extends between and electrically connects a repair via of one chip site and a repair via of another chip site.

A method of repairing an electronic package, according to the present invention, includes the step of providing a multi chip module substrate that has a plurality of chip sites, each having plurality of signal vias and plurality of repair vias. This multi chip module also has a circuit line net having a plurality of circuit lines. Each circuit line extends between and is intended to electrically connect selected signal vias. This multi chip module further includes a repair line net having a plurality of groups of repair lines. Each repair line extends between and electrically connects a repair via of one chip site and a repair via of another chip site. A method of repairing an electronic package, according to the present invention, also includes the step of identifying in a circuit intended to be composed of a first signal via, a second signal via, and a circuit line extending between and intended to electrically connect the first signal via and the second signal via a defect in one of the first signal via, the second signal via, and the circuit line extending between and intended to electrically connect the first signal via and the second signal via. A method of repairing an electronic package, according to the present invention, also includes the steps of isolating the first signal via, isolating the second signal via, electrically connecting the first signal via to that repair via of the chip site having the first signal via that is connected to that repair via of the chip site having the second signal via, and electrically connecting the second signal via to that repair via of the chip site having the second signal via that is connected to that repair via of the chip site having the first signal via.

BRIEF DESCRIPTION OF THE DRAWING

The present invention is best understood from the following detailed description when read in conjunction with the accompanying drawings.

FIGS. 3 and 4 are schematic side views of two stages of effecting a repair to an electronic package in accordance with the present invention.

DETAILED DESCRIPTION OF THE INVENTION

Figure 1:
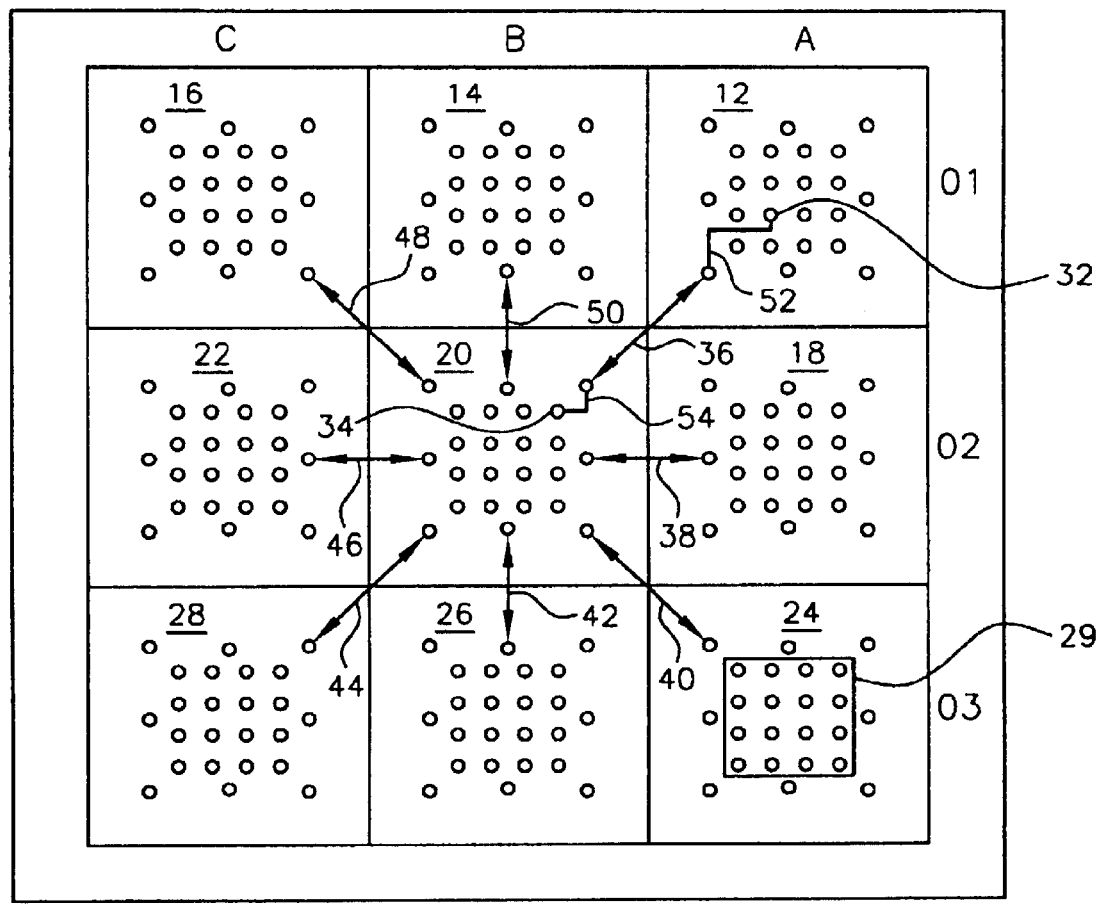
FIG. 1 is a schematic plan view of a multi chip module substrate constructed in accordance with the present invention.
Figure 2:
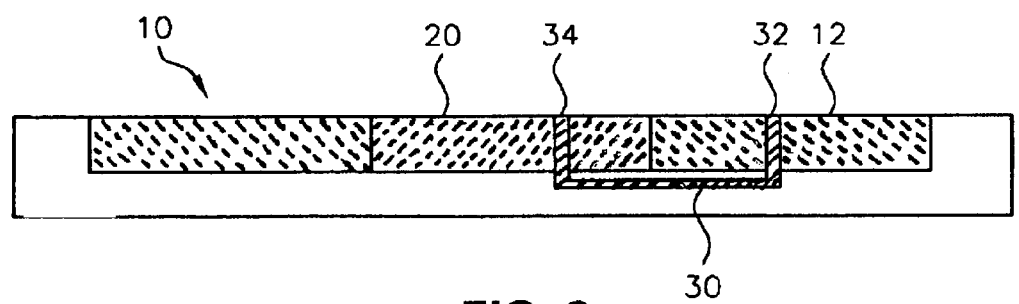
FIG. 2 is a schematic side view, in section, of the FIG. 1 multi chip module substrate.

Referring to FIGS. 1 and 2, a multi chip module substrate 10, constructed in accordance with the present invention, includes a plurality of chip sites. For the embodiment of the invention illustrated in FIGS. 1 and 2, multi chip module 10 has nine identical chip sites 12, 14, 16, 18, 20, 22, 24, 26, and 28 arranged in a 3×3 square. It will be understood that a multi chip module substrate, constructed in accordance with the present invention, can have more or less chip sites than are illustrated in FIG. 1 and that the chip sites can be disposed other than as illustrated in FIG. 1.

Each of the chip sites has a ceramic base into which a plurality of signal vias and a plurality of repair vias extend. In one preferred embodiment of the present invention, as illustrated by FIG. 1 where signal vias in a given chip site are intended to be connected to signal vias in all the other chip sites, the number of repair vias in a chip site is equal to the number of chip sites minus one.

For the embodiment of the invention illustrated in FIG. 1, each of the chip sites has sixteen signal vias disposed in a 4×4 square array, identified by a cage 29, and eight repair vias disposed uniformly outside of and surrounding the 4×4 square array of the signal vias, with three repair vias on each side of the square. It will be understood that the number and disposition of the signal vias and the repair vias of a multi chip module substrate, constructed in accordance with the present invention, can be other than as illustrated in FIG. 1. In particular, the repair vias can be located within cage area 29. Also, a chip site can be arranged with extra signal vias, so that a signal via can serve as a repair via. Under such circumstances, when a signal via serves as a repair via, the signal via is considered a repair via.

A multi chip module substrate, constructed in accordance with the present invention, also includes a circuit line net having a plurality of circuit lines. As indicated in FIG. 2, which shows only one such circuit line 30, each circuit line extends between and is intended to electrically connect selected signal vias, for example signal via 32 of chip site 12 and signal via 34 of chip site 20. Typically, the circuit lines are sub-surface lines extending from one chip site to another (i.e., within the chip sites of the multi chip module substrate) as shown in FIG. 2.

A multi chip module substrate, constructed in accordance with the present invention, further includes a repair line net having a plurality of groups of repair lines. Each of these repair lines extends between and electrically connects a repair via of one of the chip sites and a repair via of another of the chip sites. Only one such group of eight such repair lines, represented by double-arrow lines 36, 38, 40, 42, 44, 46, 48, and 50, is shown in FIG. 1. It will be understood that the repair lines, represented by the double-arrow lines on the surface of the multi chip module substrate of FIG. 1, are typically sub-surface lines (i.e., within the chip sites of the multi chip module substrate extending from one chip site to another.

In implementing the present invention, as illustrated in FIG. 1, there could be seven other groups of repair lines, with each group connecting the repair vias of one chip site with repair vias of the other eight chip sites. In particular, as represented by the eight double-arrow lines, each of the eight repair vias of chip site 20 is connected to a repair via in one of the other eight chip sites. As a result, for the embodiment of the present invention being described, the number of groups of repair lines is equal to the number of chip sites and the number of repair lines in each group is equal to number of chip sites minus one. The actual numerical relationship between the number of groups of repair lines and the number of chip sites and the number of repair lines in each group is dependent on the requirements of the particular application of the present invention.

The repair vias and the repair line net serve to repair a defect in a circuit intended to be composed of a first signal via, for example signal via 32, a second signal via, for example signal via 34, and a circuit line, for example circuit line 30, extending between and electrically connecting the first signal via and the second signal via. The defect can be an open circuit or a short circuit in the vias or in the circuit line extending between and electrically connecting the vias.

This repair is accomplished, according to the embodiment of the present invention being described, by: (1) isolating the signal vias of the circuit in which the defect has been detected by depositing a dielectric pad over the signal via, (2) depositing a first jumper conductor, for example jumper connection 52 shown in FIG. 1, between the dielectric pad on the first of the signal vias of the defective circuit and that repair via in the same chip site, for example chip site 12, that is connected to the repair via in the other chip site, for example chip site 20, in which the second signal via of the defective circuit is located; and (3) depositing a second jumper conductor, for example jumper connection 54 shown in FIG. 1, between the dielectric pad on the second of the signal vias of the defective circuit and that repair via in the same chip site, for example chip site 20, that is connected to the repair via in the other chip site, for example chip site 12, in which the first signal via of the defective circuit is located. In this way, instead of a direct connection, namely circuit line 30, between the two signal vias 32 and 34 of chip sites 12 and 20, respectively, the pads over the two signal vias 32 and 34 are connected by jumper connection 52, repair line 36, and jumper connection 54.

The repair structure and process sequence to be described are applicable to a glass ceramic substrate without thin film and for alumina or other ceramic materials with metallizations tailored to specific ceramic and internal metallurgy used. This repair structure and process sequence also may be applied to other electronic packages products such as cards and boards.

A sintered high performance glass ceramic has a plurality of signal vias, such as shown in FIG. 1. In FIGS. 3 and 4 two signal vias 32 and 56 are shown. For the example of the present invention being described, signal via 32 is in a circuit that has a defect. Signal via 56 is in a circuit that has no defect. These signal vias can be copper/nickel alloy, typically in the range of 80% to 90% copper and the balance nickel.

Circuit defects, after identification, are mapped to specific signal via locations. Alternatively, the signal vias and bottom surface metallurgy I/O pads can be plated with immersion gold (e.g., 400 A-1000 A) and diffused at 350° C.–400° C. for fifteen to twenty minutes to provide a clean surface that can be tested without contact resistance issues.

FIGS. 3 and 4 are schematic side views of a portion of the multi chip module substrate of FIGS. 1 and 2 and show two stages of effecting a repair to this multi chip module in accordance with the present invention. As indicated above, FIGS. 3 and 4 show only one signal via, namely signal via 32 of a defective circuit composed of signal via 32, signal via 34, and circuit line 30. Signal via 32 is isolated by depositing a thin dielectric 58 over this signal via. This can be done by depositing locally a thin layer of dielectric paste, such as glass or a mixture of low melting glass powders with an appropriate binder. The dispensed dielectric covers the signal via, typically 80 µm–130 µm in diameter and about one micron to 20 microns thick. After the dielectric paste has been deposited on the identified signal via, the substrate may be baked at 50° C.–70° C. to dry the dielectric paste.

The repair process of the present invention also includes isolation of the second via of the defective circuit, namely signal via 34 that is not shown in FIGS. 3 and 4. Isolation of the second signal via can be accomplished in the same manner as isolation of the first signal via.

The repair process of the present invention further includes electrically connecting the dielectric pad on the first of the signal vias of the defective circuit (e.g., signal via 32 of chip site 12) to that repair via of the same chip site that is connected to that repair via of the second chip site (e.g., chip site 20) having the second signal via (e.g., signal via 34) to which the first signal via is intended to be connected. This can be done by depositing a low temperature fired metal paste 60 to form a jumper conductor between signal via 32 and a repair via 62 of chip site 12. This metal paste can be made up, for example, of silver/palladium, or gold/palladium, or copper. The metal paste can be deposited in the desired path by a direct write paste extrusion tool. Alternatively, a trench can be created in the substrate using a process such as laser ablation forming the desired path. The metal paste may then be screened into the trench. After the metal paste has been deposited between the dielectric pad over the signal via and the repair via, the substrate may be baked at 50° C.–70° C. to dry the metal paste.

The step of electrically connecting the first signal via, namely signal via 32, to that repair via, namely repair via 62, of the first chip site, namely chip site 12, that is connected to that repair via of the second chip site, namely chip site 20, having the second signal via, namely signal via 34 to which the first via is intended to be connected further includes overcoating the first jumper conductor 60 with a dielectric 64 to form jumper connection 52 of FIG. 1. Dielectric 64 can be the same as dielectric 58 that is used to isolate signal via 32.

The repair process of the present invention further includes electrically connecting the dielectric pad on second signal via of the defective circuit (e.g., signal via 34 of chip site 20) to that repair via of the same chip site that is connected to that repair via of the first chip site (e.g., chip site 12) having the first signal via (e.g., signal via 32) to which the second signal via is to be connected. Electrically connecting the second signal via to the repair via in the same chip site by forming a second jumper conductor that extends between the second signal via and the repair via in the same chip site can be accomplished in the same manner as electrically connecting the first signal via to the repair via in the same chip site.

The step of electrically connecting the second signal via, namely signal via 34 to that repair via of the second chip site, namely chip site 20, that is connected to that repair via, namely repair via 62, of the first chip site, namely chip site 12, having the first signal via, namely signal via 32, to which the second signal via is intended to be connected further includes overcoating the second jumper conductor with a dielectric. Overcoating the second jumper conductor can be accomplished in the same manner as overcoating jumper conductor 60 to form jumper connection 54 of FIG. 1.

The multi layer ceramic then is fired to bond: (1) the thin dielectric (e.g., dielectric 58) over the first signal via (e.g., signal via 32) to the first signal via, (2) the thin dielectric over the second signal via to the second signal via, (3) the first jumper conductor (e.g., jumper conductor 60) to the ceramic base of the chip site (e.g., chip site 12) having the first signal via and that repair via of the chip site having the first signal via that is connected to that repair via of the chip site (e.g., chip site 20) having the second signal via (e.g., signal via 34), (4) the second jumper conductor to the ceramic base of the chip site (e.g., chip site 20) having the second signal via (e.g., signal via 34) and that repair via of the chip site having the second signal via that is connected to that repair via of the chip site (e.g., chip site 12) having the first signal via (e.g., signal via 32), (5) the dielectric overcoating (e.g., dielectric 64) of the first jumper conductor (e.g., jumper conductor 60) to the first jumper conductor, and (6) the dielectric overcoating of the second jumper conductor to the second jumper conductor. Preferably, this firing step, also known as post-sinter fire, is conducted at a temperature in the 500° C. to 700° C. range in $N_2$ or a forming gas atmosphere.

It will be noted that for the embodiment of the present invention illustrated in the drawings and being described the step of depositing the jumper conductors includes depositing the jumper conductor over the thin dielectric over the first signal via and the second signal via and the step of overcoating the jumper conductors with a dielectric includes overcoating the jumper conductors over the first signal via and the second signal via with the dielectric overcoatings. Accordingly, in accordance with the present invention, the dielectric overcoatings over the first signal via and the second signal via are removed to expose the first jumper conductor over the first signal via and to expose the second jumper conductor over the second signal via.

Preferably, the dielectric overcoatings over the signal vias are removed by ablation by a suitable laser. Each opening above a signal via is typically 10 $\mu$m to 20 $\mu$m larger in diameter than the nominal signal via size (e.g., for a 100 $\mu$m signal via, the opening is 110 $\mu$m–120 $\mu$m). The reason for the larger opening is to compensate for the slightly raised signal via pad created by the repair process. The signal via solder spreads over a larger area than the normal signal via size and has an effective joint height that is 10 $\mu$m–15 $\mu$m shorter. With the repair pad higher by approximately 15 to 20 microns, the design feature just described will prevent excessive signal via bulging and potential shorting to a neighboring signal via which concern is somewhat limited to a fine pitch arrangement, such as 100 $\mu$m signal vias on 200 $\mu$m. A pulsed carbon dioxide laser or an excimer laser with good absorption in the dielectric layer can be used to form the openings in the dielectric overcoatings.

At this stage, the multi chip module substrate 10 undergoes the normal finishing process that is used for glass-ceramic without thin films. Electroless nickel/phosphorous (e.g., 3 $\mu$m–5 $\mu$m) followed by immersion gold is deposited on the signal vias, including the vias in the repaired circuits, and bottom surface metallurgy I/O pads. After these plating steps, the multi chip module substrate is taken through a 350° C.–400° C. diffusion step in forming gas to promote bonding between plated nickel/gold with underlying copper/nickel metallurgy (for sintered vias in circuits that did not require any repair) or the deposited silver/palladium or gold palladium metallurgy used on the signal vias in circuits that have been repaired.

Although illustrated and described herein with reference to certain exemplary embodiments, the present invention, nevertheless, is not intended to be limited to the details shown and described. Rather, various modifications may be made to those exemplary embodiments within the scope and range of equivalents of the claims without departing from the invention.

What is claimed:

1. A multi chip module substrate comprising:
    a plurality of chip sites each having:
       (a) a plurality of signal vias, and
       (b) a plurality of repair vias;
    a circuit line net having a plurality of circuit lines, each said circuit line extending between and intended to electrically connect selected signal vias; and
    a repair line net having a plurality of groups of repair lines, each said repair line extending between and electrically connecting a repair via of one said chip site and a repair via of another said chip site.

2. A multi chip module substrate according to claim 1 wherein said circuit lines are within said chip sites and said repair lines are within said chip sites.

3. A multi chip module substrate according to claim 1 wherein said repair vias are outside of and surrounding an array of said signal vias.

4. A multi chip module substrate according to claim 3 wherein said chip sites are identical.

5. A multi chip module substrate according to claim 1 wherein said repair vias are disposed uniformly outside of and surrounding an array of said signal vias.

6. A multi chip module substrate according to claim 5 wherein said chip sites are identical.

7. A multi chip module substrate according to claim 1 further including:
   (a) a first jumper connection extending between and electrically connecting a first signal via in a first chip site and that repair via in said first chip site that is connected to a repair via in a second chip site in which a second signal via is located and to which said first signal via is intended to be connected; and
   (b) a second jumper connection extending between and electrically connecting said second signal via in said second chip site and that repair via in said second chip site that is connected to said repair via in said first chip site to which said first signal via is electrically connected.

8. A multi chip module substrate according to claim 7 wherein said circuit lines are within said chip sites and said repair lines are within said chip sites.

9. A multi chip module substrate according to claim 7 wherein said repair vias are outside of and surrounding an array of said signal vias.

10. A multi chip module substrate according to claim 9 wherein said chip sites are identical.

11. A multi chip module substrate according to claim 7 wherein said repair vias are disposed uniformly outside of and surrounding an array of said signal vias.

12. A multi chip module substrate according to claim 11 wherein said chip sites are identical.

13. A multi chip module substrate according to claim 1 wherein:
   (a) the number of said repair vias in each said chip site is equal to the number of said chip sites minus one,
   (b) the number of said groups of said repair lines is equal to the number of said chip sites, and
   (c) the number of said repair lines in each said group is equal to the number of said chip sites minus one.

14. A multi chip module substrate according to claim 4 wherein:
   (a) the number of said repair vias in each said chip site is equal to the number of said chip sites minus one,
   (b) the number of said groups of said repair lines is equal to the number of said chip sites, and
   (c) the number of said repair lines in each said group is equal to the number of said chip sites minus one.

15. A multi chip module substrate according to claim 7 wherein:
   (a) the number of said repair vias in each said chip site is equal to the number of said chip sites minus one,
   (b) the number of said groups of said repair lines is equal to the number of said chip sites, and
   (c) the number of said repair lines in each said group is equal to the number of said chip sites minus one.

16. A method of repairing an electronic package comprising the steps of:
   providing a multi chip module substrate including:
     (a) a plurality of chip sites each having:
       (1) plurality of signal vias, and
       (2) plurality of repair vias,
     (b) a circuit line net having a plurality of circuit lines, each said circuit line extending between and intended to electrically connect selected signal vias, and
     (c) a repair line net having a plurality of groups of repair lines, each said repair line extending between and electrically connecting a repair via of one said chip site and a repair via of another said chip site;
   identifying in a circuit intended to be composed of:
     (a) a first signal via in a first chip site,
     (b) a second signal via in a second chip site, and
     (c) a circuit line extending between and intended to electrically connect said first signal via and said second signal via a defect in one of:
       (a) said first signal via,
       (b) said second signal via, and
       (c) said circuit line extending between and intended to electrically connect said first signal via and said second signal via;
   isolating said first signal via;
   isolating said second signal via;
   electrically connecting said first signal via in said first chip site to that repair via in said first chip site that is connected to a repair via in said second chip site; and
   electrically connecting said second signal via in said second chip site to that repair via in said second chip site that is connected to said repair via in said first chip site connected to said first signal via.

17. A method of repairing an electronic package according to claim 16 wherein:
   (a) the step of isolating said first signal via includes depositing a thin dielectric over said first signal via,
   (b) the step of isolating said second signal via includes depositing a thin dielectric over said second signal via,
   (c) the step of electrically connecting said first signal via in said first chip site to that repair via in said first chip site that is connected to a repair via in said second chip site includes depositing a first jumper conductor between said first signal via in said first chip site and that repair via in said first chip site that is connected to a repair via in said second chip site; and
   (d) the step of electrically connecting said second signal via in said second chip site to that repair via in said second chip site that is connected to said repair via in said first chip site connected to said first signal via includes depositing a second jumper conductor between said second signal via in said second chip site and that repair via in said second chip site that is connected to a repair via in said first chip site.

18. A method of repairing an electronic package according to claim 17 wherein:
   (a) the step of electrically connecting said first signal via in said first chip site to that repair via in said first chip site that is connected to a repair via in said second chip site further includes overcoating said first jumper conductor with a dielectric, and
   (b) the step of electrically connecting said second signal via in said second chip site to that repair via in said second chip site that is connected to said repair via in said first chip site further includes overcoating said second jumper conductor with a dielectric.

19. A method of repairing an electronic package according to claim 18:
   (a) wherein each of said chip sites further includes a ceramic base into which said signal vias and said repair vias extend, and
   (b) said method further includes the step of firing the electronic package to bond:
      (1) said thin dielectric over said first signal via to said first signal via,
      (2) said thin dielectric over said second signal via to said second signal via,
      (3) said first jumper conductor to said ceramic base of said chip site having said first signal via and that repair via of the chip site having said first signal via that is connected to that repair via of the chip site having said second signal via,
      (4) said second jumper conductor to said ceramic base of said chip site having said second signal via and that repair via of the chip site having said second signal via that is connected to that repair via of the chip site having said first signal via,
      (5) said dielectric overcoating of said first jumper conductor to said first jumper conductor, and
      (6) said dielectric overcoating of said second jumper conductor to said second jumper conductor.

20. A method of repairing an electronic package according to claim 19 wherein:
   (a) the step of depositing said first jumper conductor includes depositing said first jumper conductor over said thin dielectric over said first signal via,
   (b) the step of depositing said second jumper conductor includes depositing said second jumper conductor over said thin dielectric over said second signal via,
   (c) the step of overcoating said first jumper conductor with a dielectric includes overcoating said first jumper conductor over said first signal via with said dielectric overcoating said first jumper conductor,
   (d) the step of overcoating said second jumper conductor with a dielectric includes overcoating said second jumper conductor over said second signal via with said dielectric overcoating said second jumper conductor, and
   (e) said method further includes the steps of:
      (1) removing said dielectric overcoating over said first signal via to expose said first jumper conductor over said first signal via, and
      (2) removing said dielectric overcoating over said second signal via to expose said second jumper conductor over said second signal via.

* * * * *